United States Patent [19]

Shosaku

[11] Patent Number: 4,611,195
[45] Date of Patent: Sep. 9, 1986

[54] DIGITAL-TO-ANALOG CONVERTER

[75] Inventor: Tsukagoshi Shosaku, Tokyo, Japan

[73] Assignee: Oki Electric Industry Co., Ltd., Tokyo, Japan

[21] Appl. No.: 683,191

[22] Filed: Dec. 18, 1984

[30] Foreign Application Priority Data

Dec. 21, 1983 [JP] Japan ............................ 58-239621

[51] Int. Cl.⁴ ............................................. H03M 1/12
[52] U.S. Cl. ........................ 340/347 DA; 340/347 M
[58] Field of Search ..................... 340/347 DA, 347 M

[56] References Cited

U.S. PATENT DOCUMENTS 4,200,863  4/1980  Hodges et al. ............. 340/347 AD
4,340,882  7/1982  Maio et al. ................. 340/347 DA
4,412,208 10/1983  Akazawa et al. ........... 340/347 DA Primary Examiner—William M. Shoop, Jr.
Assistant Examiner—Saul M. Bergmann
Attorney, Agent, or Firm—Wenderoth, Lind & Ponack

[57] ABSTRACT

A digital-to-analog converter is composed of a first array of capacitors for generating an analog voltage corresponding to the code value of a digital input signal, and a resistive voltage divider for dividing a reference voltage and applying a divided voltage to the first array of capacitors. The digital-to-analog converter also includes a second array of capacitors for applying a corrective voltage to the first array of capacitors and a memory circuit for controlling the second array of capacitors.

7 Claims, 6 Drawing Figures

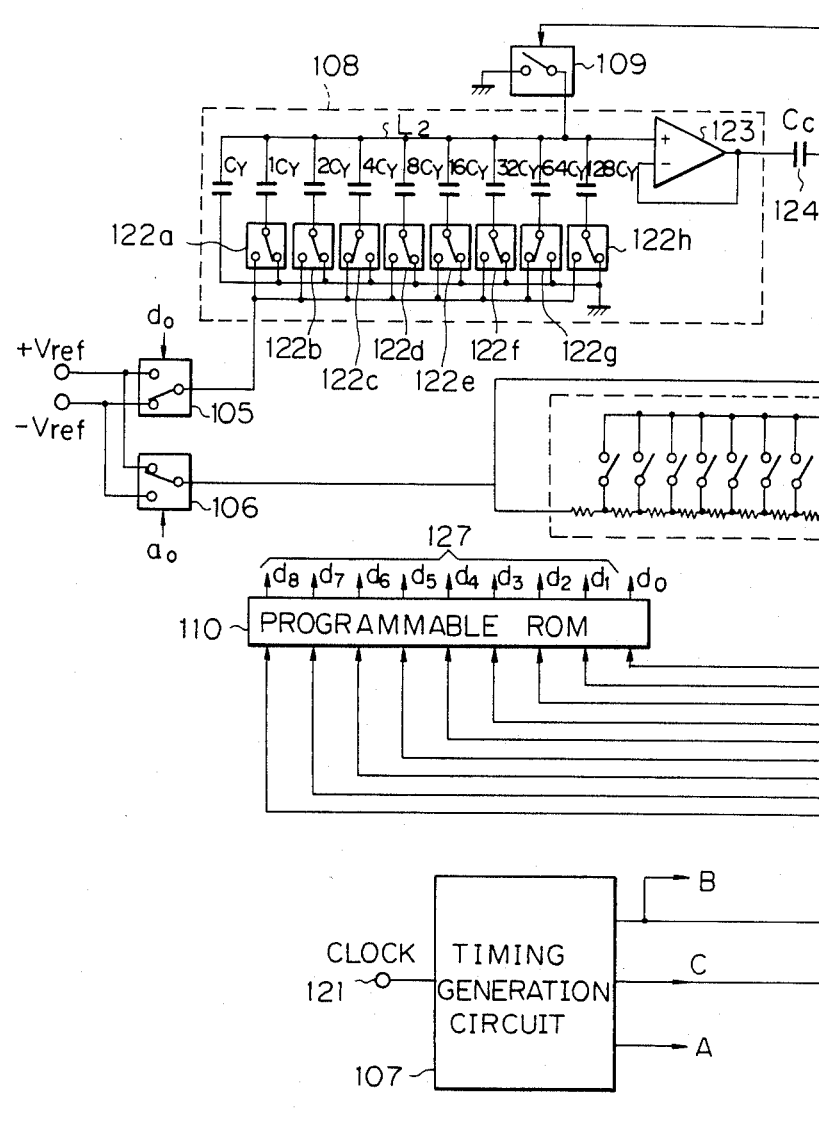

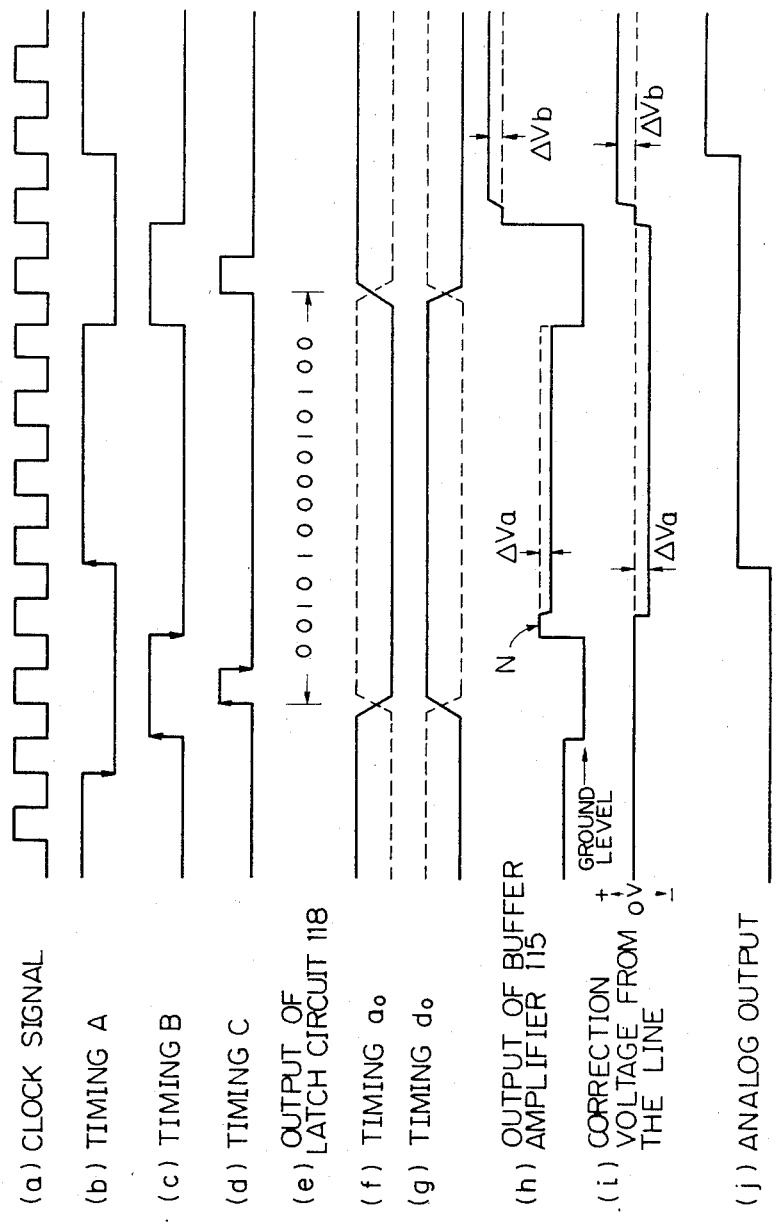

DIGITAL-TO-ANALOG CONVERTER

BACKGROUND OF THE INVENTION

The present invention relates to a digital-to-analog converter (hereinafter referred to as a "D/A converter), and more particularly to a D/A converter including an array of capacitors and voltage dividers composed of resistors.

D/A converters including an array of capacitors have in recent years found growing use as output means in digital electronic devices since they can easily be fabricated as MOS ICs.

A number of weighted capacitors used as a capacitor array are generally formed by MOS capacitors and are of a greater dimensional accuracy than other passive components, so that D/A converters of the above type have highly accurate characteristics.

However, a D/A converter with a capacitor array uses several hundred MOS capacitors or more of a unit capacitance (for example, 0.1 pF), and hence it is difficult to reduce the IC chip area. To avoid this drawback, it has been practice to add a voltage divider composed of resistors for reducing the number of arrayed capacitors used. Such a technique is disclosed in Japanese Patent Application No. 56-8946 entitled "Digital-to-analog converter", for example.

The capacitor-array D/A converter including a resistive voltage divider and having a resolution of 14 bits or more has a disadvantage in that when actuating capacitor switches, the conversion characteristic is shifted $\Delta Va$ or $\Delta Vb$ in a positive or negative direction as shown in FIG. 1 of the accompanying drawings, and hence has poor linearity.

When the 14-bit D/A converter is operated under two reference voltages of $+3$ V and $-3$ V, for example, the resolution $\Delta Vc$ is about 0.4 mV. Where the switches are actuated with a digital input code value 00000000011111, the shifted voltage $\Delta Va$ becomes about 11 mV which indicates a variation greater than the resolution voltage.

Such a phenomenon results from variations in the capacitances of MOS capacitors fabricated in an IC and the resistances of the resistors. It has therefore been quite difficult to put to practical use capacitor-array D/A converters having a resolution of 14 bits or greater.

SUMMARY OF THE INVENTION

It is an object of the present invention to provide a capacitor-array D/A converter having good conversion linearity and high accuracy.

According to the present invention, a D/A converter corrects an error of an analog voltage corresponding to a code value of a digital input voltage with a memory circuit storing data corresponding to error voltages and a capacitor array for adding a corrective voltage to the analog voltage, so that the output characteristics will be approximated to an ideal curve.

BRIEF DESCRIPTION OF THE DRAWINGS

FIG. 3 is a timing diagram of signals in the circuit shown in FIG. 2.

DETAILED DESCRIPTION OF THE PREFERRED EMBODIMENT

The present invention for attaining the above-mentioned objects will now be described in detail with reference to an embodiment illustrated in the accompanying drawings.

Figure 1:
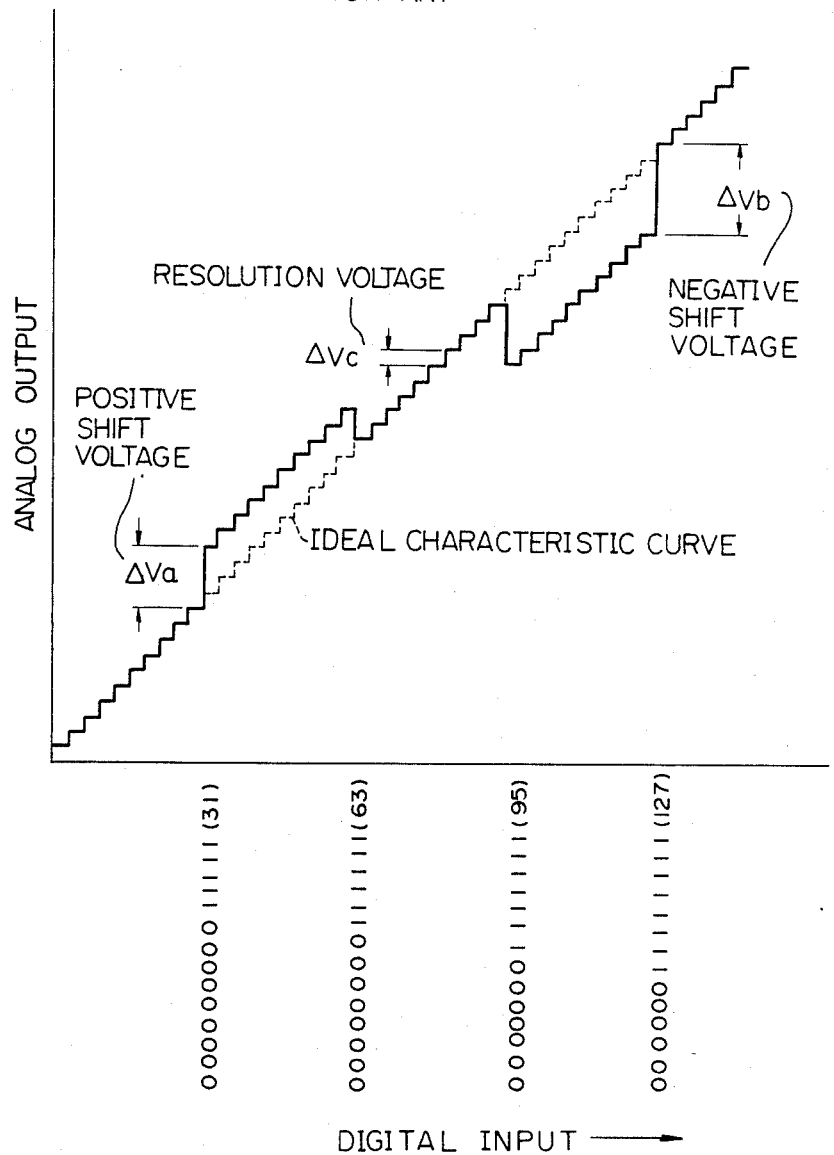
FIG. 1 is a diagram showing output characteristics of a conventional D/A converter including a capacitor ladder and a voltage divider.
Figure 2B:
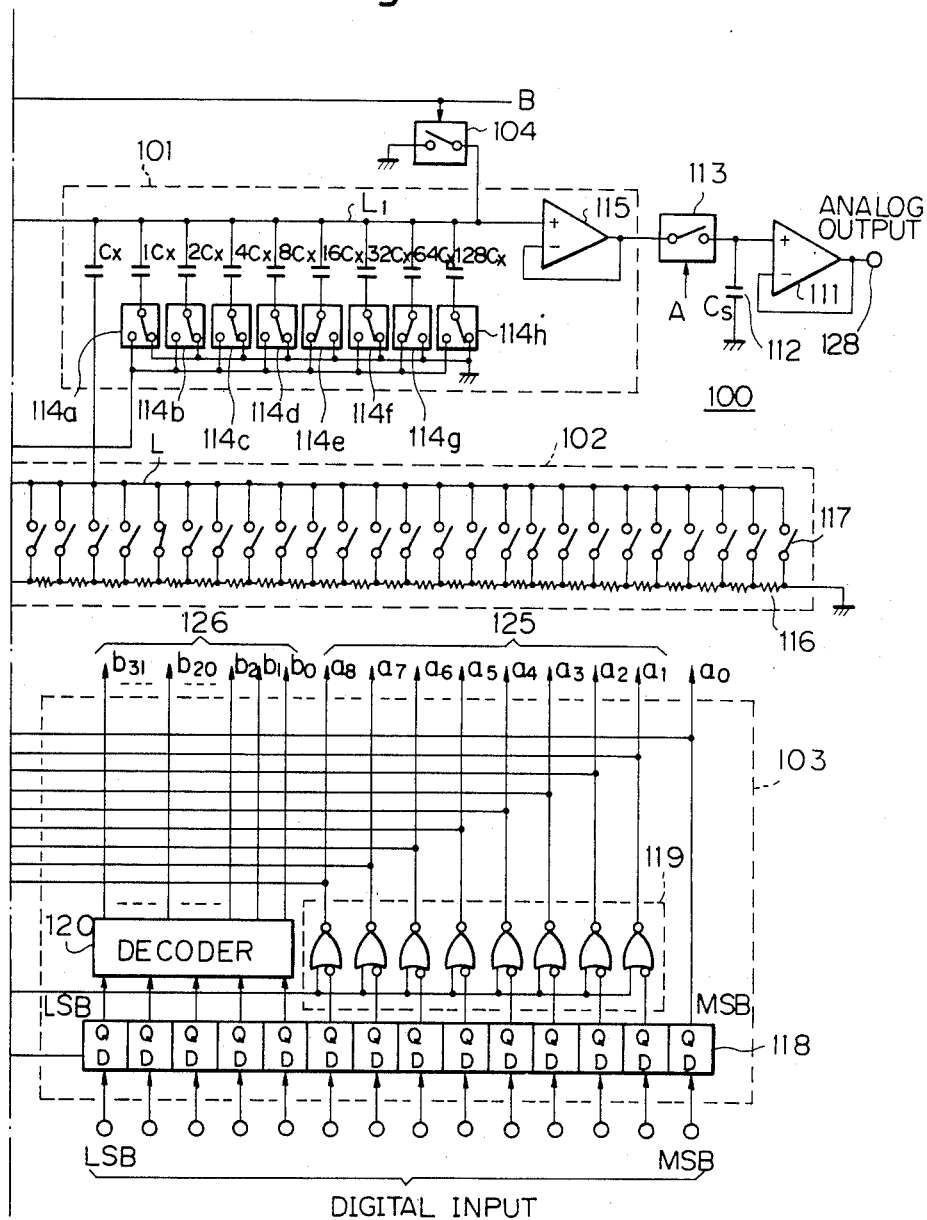
FIG. 2, which consists of FIGS. 2A and 2B, is a circuit diagram of a D/A converter including a capacitor ladder and a voltage divider according to the present invention. It is noted that it was necessary to split FIG. 2 into FIGS. 2A and 2B in view of its complexity.

FIG. 2, consisting of FIGS. 2A and 2B, shows a D/A converter according to the present invention, the D/A converter being a 14-bit D/A converter for example.

In FIG. 2, i.e.-FIGS. 2A and 2B, the D/A converter comprises a sampling circuit 100, a first variable-capacitance voltage divider 101, a variable-resistance voltage divider 102, a control circuit 103, switches 104 and 106, a timing generator circuit 107, a second variable-capacitance voltage divider 108, switches 105 and 109, a programmable ROM 110, and a coupling capacitor 124.

The sampling circuit 100 is composed of a buffer amplifier 111 having a high input impedance, a sampling capacitor 112 for holding a sampled signal, and a switch 113 for sampling a signal for a prescribed period of time in response to a control signal.

The first variable-capacitance voltage divider 101 includes a capacitor array composed of a unit capacitor $Cx$ and a plurality of capacitors $1Cx, 2Cx, 4Cx, \ldots 128Cx$ having capacitances which are weighted 1 time, 2 times, 4 times, ... 128 times the capacitance of the unit capacitor $Cx$, a plurality of capacitor switches 114a through 114h, and a buffer amplifier 115 having a high impedance.

The capacitors $1Cx$ through $128Cx$ have upper plates connected in common to a line $L_1$ and lower plates connected respectively to the capacitor switches 114. The variable-capacitance voltage divider 101 outputs an analog signal voltage corresponding to an applied 14-bit digital input voltage through the buffer amplifier 115. In the D/A converter fabricated as a semiconductor IC, the arrayed capacitors should preferably be fabricated as MOS capacitors, and large capacitors should preferably be formed by connecting a plurality of unit capacitors $Cx$ in parallel for achieving highly accurate capacitances.

The variable-resistance voltage divider 102 is composed of a plurality of resistors 116 and a plurality of changeover switches 117 connected to taps of the resistors 116. The changeover switches 117 have ends connected in common to a line $L_3$ coupled to a lower plate of the unit capacitor $Cx$. The resistors 116 should preferably be formed from diffused resistors in the range of from about 1 to 10k$\Omega$. In the embodiment, the variable-resistance voltage divider 102 applies a voltage which is a multiple of 1/32 of a reference voltage Vref to the line $L_3$.

The control circuit 103 comprises a register 118, a gate circuit 119, and a decoder 120. The register 118 has input terminals DIGITAL INPUT supplied with a 14-bit absolute binary code with its MSB being a sign bit.

The gate circuit 119 is responsive to a control signal for generating high-order bit signals $a_1$ through $a_8$ (for example, 2nd through 9th bit signals) except for the MSB to control the changeover of the capacitor switches 114a through 114h in the variable-capacitance circuit 101.

The decoder 120 is responsive to low-order bits (for example, 10th through 14th bit signals) of an applied digital signal for selecting one of 32 signal lines $b_0$ through $b_{31}$ to turn on one of the changeover switches 117 in the variable-resistance voltage divider 102. This applies a voltage derived by dividing the reference voltage +Vref or −Vref to the unit capacitor Cx.

The changeover switch 106 is responsive to a control signal $a_0$ (the MSB of the digital signal) for supplying the positive or negative reference voltage Vref to the lower plates of the arrayed capacitors 1Cx through 128Cx and one terminal end of the resistor voltage divider 102.

The switch 104 serves to selectively ground the line $L_1$ of the variable-capacitance voltage divider 101 in response to a control signal.

The timing generator circuit 107 is responsive to a clock signal applied to a clock terminal 121 for generating a timing signal C to latch the registor 118, a timing signal B to control the gate circuit 119 and the changeover switches 104 and 109, and a timing signal A to control the sampling switches 113.

The variable-capacitance voltage divider 108 is composed of an array of a unit capacitor Cy and plural capacitors 1Cy, 2Cy, 4Cy, . . . 128Cy having capacitances which are weighted 1 time, 2 times, 4 times, . . . 128 times the capacitance of the unit capacitor Cy, a plurality of capacitor switches 122a through 122h, and a buffer amplifier 123 having a high input impedance. The capacitors 1Cy through 128Cy have upper plates connected in common to a line $L_2$ and lower plates connected respectively to the capacitor switches 122a through 122h. The unit capacitor Cy has a lower electrode connected to a ground potential.

The switch 109 is controlled by the timing signal B from the timing generator 107 for selectively grounding the line $L_2$.

The memory circuit 110, for example a program ROM, issues output signals $d_0$ through $d_8$ when addressed by the sign bit (MSB) and high-order bits (for example, the 2nd through 9th bits) of the digital input signal. The capacitor switches 122a through 122h in the variable-capacitance voltage divider 108 are controlled by the output signals $d_1$ through $d_8$. The programable ROM 110 stores data representative of corrective voltages, which are obtained by finding error voltages (shifted voltages) $\Delta V$ of all analog output voltages corresponding to all output codes of the registor 118 at the time that only the variable-resistance voltage divider 101 is used.

The switch 105 is controlled by the MSB ($d_0$) of the output signal from the programable ROM 110 for applying the reference voltage +Vref or −Vref to the lower plates of the array of capacitors 1Cy through 128Cy.

The coupling capacitor 124 couples the variable-capacitance voltage dividers 101 and 108 for impressing the corrective voltage supplied from the variable-capacitance voltage divider 108 on the variable-capacitance voltage divider 101. The coupling capacitor 124 should preferably be constructed of a MOS capacitor and have a capacitance of about 0.1 pF, for example.

A corrected output voltage $V_0$ appearing on the line $L_1$ of the variable-capacitance voltage divider 101 is expressed by the following equation:

$$V_0 = (-1) a_0 [Vref/(256Cx + Cc)] (128Cx \cdot a_1 + 64Cx \cdot a_2 + 32Cx \cdot a_3 + 16Cx \cdot a_4 + 8Cx \cdot a_5 + 4Cx \cdot a_6 + 2Cx \cdot a_7 + Cx \cdot a_8 + (m/32)Cx) + (-1)^{d_0} [Cc/256Cx + Cc)] (Vref/256Cy) (128Cy \cdot d_1 + 64Cy \cdot d_2 + 32Cy \cdot d_3 + 16Cy \cdot d_4 + 8Cy \cdot d_5 + 4Cy \cdot d_6 + 2Cy \cdot d_7 + Cy \cdot d_8) \quad (1)$$

where Cx, 1Cx through 128Cx, Cy 1Cy through 128Cy, and Cc are the capacitances of the capacitors, $a_0$ through $a_8$ are the output signals 125 from the gate circuit 119 which take the value of "1" or "0", m is an integer ranging from 0 through 31 determined by the output signal 126 from the decoder 120, and $d_0$ through $d_8$ are the output signals 127 from the programmable ROM 110 which take the value of "1" or "0". The second term of the equation (1) is indicative of the corrective voltage produced by the variable-capacitance voltage divider 108 and applied through the coupling capacitor 124 to the line $L_1$ of the variable-capacitance voltage divider 101.

Operation of the D/A converter of the invention will be described with reference to the timing chart of FIG. 3.

It is assumed that the D/A converter operates under 3 V from the reference voltage power supply, and the DIGITAL INPUT is supplied with a 14-bit absolute binary code 00101000010100.

When the timing signal A changes from a "1" level to a "0" level, the switch 113 is turned off to enable the sampling circuit 100 to hold a previous analog voltage.

As the timing signal B goes to a "1" level, the output signal 125 from the gate circuit 119 becomes 00000000 to enable the switches 114a through 114h in the variable-capacitance voltage divider 101 to connect the lower plates of the array of capacitors 1Cx through 128Cx to the ground potential.

At the same time, the switches 104 and 109 are closed to ground the lines $L_1$ and $L_2$. The output signal 127 from the programable ROM 110 also becomes 00000000 to enable the switches 122a through 122h to connect the lower plates of the array of capacitors 1Cy through 128Cy to the ground potential. Therefore, the charges in all of the arrayed capacitors are discharged, and the output voltage from the buffer amplifier 115 falls to 0 V.

When the timing signal C goes to a "1" level, the digital signal 00101000010100 is latched in the register 118. When the timing signal C changes from the "1" level to "0" level, the digital input signal is stored in the register 118.

As the timing signal B changes from the "1" to "0" level, the switches 104 and 109 are turned off. Since the MSB (sign bit) $a_0$ of the digital input signal is "0", the switch 106 is shifted over to +Vref (+3 V, for example) (see FIG. 3(f)).

If the error in the variable-capacitance voltage divider 101 at the time the code 00101000010100 is applied is "positive", then the MSB $d_0$ of the output signal from the programable ROM 110 goes to a "1" level whereupon the switch 105 selects −Vref (−3 V, for example) (see FIG. 3(g)).

Simultaneously, the low-order bits (the 10th through 14th bits) of the output signal from the register 118 are processed by the decoder 120 so that the bit $b_{20}$ over an output line 126 becomes "1", selecting the 20th switch 117.

The capacitor Cx is now charged to +20/32 Vref of the reference voltage.

At the same time, the high-order bits (the 2nd through 9th bits) of the digital output signal from the register 118 are output as an output signal to select the switches 114e and 114g in the variable-capacitance voltage divider 101 for connecting the lower plates of the capacitors 16Cs and 64Cx to +Vref.

The capacitor array in the variable-capacitance voltage divider 101 now generates, over the line $L_1$, a voltage indicated by N in FIG. 3(h), which corresponds to the code value of the digital input signal.

Simultaneously, the variable-capacitance voltage divider 108 forms a voltage divider circuit corresponding to the code value of the output signal 127 from the programable ROM 110, and the buffer amplifier 123 adds a corrective voltage to the line $L_1$ of the variable-capacitance voltage divider 101 for shifting the voltage by $\Delta Va$ in the negative direction (see FIG. 3(i)).

The voltage on the line $L_1$ of the voltage divider 101 is then adjusted to a true analog voltage representative of the code value of the digital input signal (see FIG. 3(h)).

When the timing signal A goes from the "0" to "1" level, the switch 113 is turned on to hold the output voltage from the buffer amplifier 115 in the capacitor 112, and the corrected analog voltage indicative of the digital input signal is issued from the buffer amplifier 111 (see FIG. 3(j)).

Digital signals will successively be converted into corresponding analog signals in the manner described above.

Figure 4:
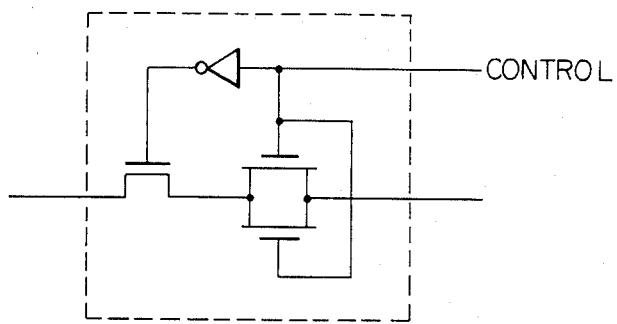
FIGS. 4 and 5 are circuit diagrams of MOS transistors having switching fuctions employed in the circuit of FIG. 2.
Figure 5:
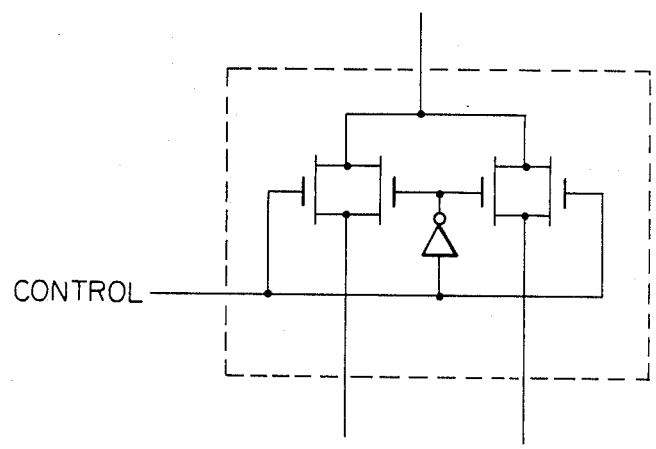

In the embodiment of the invention, each of the switches 104, 109, 112, 117 is constructed of a MOS transistor as shown in FIG. 4, and each of the switches 105, 106, 114, 122 is constructed of a MOS transistor as illustrated in FIG. 5.

The programable ROM may comprise an EPROM.

Where the digital input signal is composed of a plurality of binary codes, they may be converted by a code converter circuit into an absolute binary code which will be applied to the register 118.

With the D/A converter of the invention, as described above, error voltages of analog signals corresponding to digital signal codes are stored in advance as data in the programable ROM, so that the analog voltages can be corrected highly accurately for the respective digital signal codes.

The capacitor-array D/A converter with a resistive voltage divider, which is of good linearity and high accuracy, can easily be fabricated as a MOS IC.

The D/A converter of the invention is advantageously employed in PCM audio devices, precision digital measurement devices, and the like.

What is claimed is:

1. A digital-to-analog converter comprising:
(a) a first array of capacitors for generating an analog voltage corresponding to the code value of a digital input signal;
(b) a resistive voltage divider for dividing a reference voltage and for applying a divided voltage to said first array of capacitors;
(c) a second array of capacitors for applying a corrective voltage to said first array of capacitors; and
(d) a memory circuit for controlling said second array of capacitors.

2. A digital-to-analog converter comprising:
(a) an array of capacitors for generating an analog voltage corresponding to the code value of a digital input singal;
(b) a resistive voltage divider for dividing a reference voltage and for applying a divided voltage to said array of capacitors;
(c) a memory circuit storing data indicative of corrective voltages;
(d) a variable-capacitance voltage divider controllable by data from said memory circuit for issuing a corrective voltage; and
(e) a coupling capacitor for applying the corrective voltage issued from said variable-capacitance voltage divider to said array of capacitors.

3. A digital-to-analog converter according to claim 2, wherein said variable-capacitor voltage divider comprises a buffer amplifier having a high input impedance for issuing said corrective voltage to said coupling capacitor, an array of a unit capacitor and plural capacitors having weighted capacitances, said capacitors of said array each having one plate connected in common to an input terminal of said buffer amplifier, and a plurality of switches connected to another plate of each of said capacitors of said array and controllable by the data from said memory circuit for selectively connecting said other plates of said capacitors to a ground potential or a reference potential.

4. A digital-to-analog converter according to claim 3, wherein each of said arrays of capacitors comprises MOS capacitors.

5. A digital-to-analog converter according to claim 3, wherein each of said switches comprises a MOS transistor.

6. A digital-to-analog converter according to claim 2, further including a control circuit responsive to said digital input signal for controlling said memory circuit.

7. A digital-to-analog converter according to claim 6, wherein said control circuit comprises a register for temporarily storing said digital input signal, a gate circuit for applying a high-order output signal, except an MSB, from said register to said memory circuit, and a decoder for controlling said resistive voltage divider in response to a low-order bit output signal from said register.

* * * * *